(12) United States Patent
Pei

(10) Patent No.: US 8,475,596 B2
(45) Date of Patent: *Jul. 2, 2013

(54) APPARATUS TO PROCESS COATING MATERIAL USING FLAME NOZZLE AND EVAPORATION DEPOSITION DEVICE HAVING SAME

(75) Inventor: Shao-Kai Pei, Taipei Hsien (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 280 days.

This patent is subject to a terminal disclaimer.

(21) Appl. No.: 12/910,846

(22) Filed: Oct. 24, 2010

(65) Prior Publication Data

US 2012/0012050 A1 Jan. 19, 2012

(30) Foreign Application Priority Data

Jul. 16, 2010 (TW) .............................. 99123585 A

(51) Int. Cl.
| | |
|---|---|
| C23C 16/00 | (2006.01) |
| C23C 14/00 | (2006.01) |
| B05C 11/00 | (2006.01) |
| B05B 5/00 | (2006.01) |
| C08F 2/46 | (2006.01) |
| B05B 3/00 | (2006.01) |

(52) U.S. Cl.
USPC ............ 118/726; 118/47; 118/50.1; 118/600; 118/641; 118/723 VE; 427/522; 427/248.1; 427/444; 392/389; 219/521; 373/122

(58) Field of Classification Search
USPC ... 118/726, 723 VE, 50.1, 600, 641; 117/213; 427/99, 248.1, 497, 223, 226, 314, 444, 561; 392/389; 29/283.5, 428; 431/289; 219/521; 373/122, 125

See application file for complete search history.

(56) References Cited

U.S. PATENT DOCUMENTS

| | | | | |
|---|---|---|---|---|
| 2,469,929 | A * | 5/1949 | Osterberg et al. | 118/713 |
| 3,743,261 | A * | 7/1973 | Kinsch, Jr. et al. | 266/99 |
| 4,944,245 | A * | 7/1990 | Stoessl et al. | 118/726 |
| 5,112,644 | A * | 5/1992 | Seddon et al. | 427/569 |
| 6,011,904 | A * | 1/2000 | Mattord | 392/389 |
| 6,050,446 | A * | 4/2000 | Lei et al. | 220/819 |
| 6,210,755 | B1 * | 4/2001 | Fuchs et al. | 427/255.34 |
| 6,237,529 | B1 * | 5/2001 | Spahn | 118/726 |
| 6,284,172 | B1 * | 9/2001 | Hume | 264/40.5 |
| 6,776,850 | B2 * | 8/2004 | Liao et al. | 118/728 |
| 7,101,442 | B2 * | 9/2006 | Choi et al. | 118/733 |
| 7,291,224 | B2 * | 11/2007 | Koninckx et al. | 117/84 |
| 7,893,939 | B2 * | 2/2011 | Geiger et al. | 345/424 |

(Continued)

*Primary Examiner* — Dah-Wei Yuan
*Assistant Examiner* — Karl Kurple
(74) *Attorney, Agent, or Firm* — Altis Law Group, Inc.

(57) ABSTRACT

An apparatus for processing coating material includes a crucible having a receptacle for receiving coating material, a drive member having a drive shaft, a cover coupled to the drive shaft, and a flame nozzle opposing the receptacle. The cover includes an inner chamber, a first through hole and a number of second through holes. The first through hole and the second through holes communicate with the inner chamber. The cover has a flat surface with the second through holes exposed at the flat surface. The drive shaft drives the cover to rotate between a closed position where the cover covers the receptacle and the flat surface presses against the coating material to flatten the coating material, and an open position where the cover is moved away from the receptacle. The flame nozzle sprays flame from the second through holes through the first through hole to heat the coating material.

18 Claims, 4 Drawing Sheets

U.S. PATENT DOCUMENTS

| | | | |
|---|---|---|---|
| 7,946,134 B2* | 5/2011 | Atkins et al. | 65/412 |
| 7,962,016 B2* | 6/2011 | Choe et al. | 392/389 |
| 2002/0040682 A1* | 4/2002 | Ramsay | 118/723 EB |
| 2004/0118155 A1* | 6/2004 | Brown et al. | 65/17.2 |
| 2005/0000411 A1* | 1/2005 | Aerts et al. | 117/92 |
| 2005/0106322 A1* | 5/2005 | Yamazaki et al. | 427/294 |
| 2005/0217567 A1* | 10/2005 | Koninckx et al. | 117/95 |
| 2006/0192026 A1* | 8/2006 | Noujaim | 239/79 |
| 2008/0136069 A1* | 6/2008 | Reddy et al. | 266/207 |
| 2008/0173241 A1* | 7/2008 | Priddy et al. | 118/726 |
| 2009/0098280 A1* | 4/2009 | Tahon | 427/69 |
| 2011/0139073 A1* | 6/2011 | Reed et al. | 118/729 |
| 2012/0006267 A1* | 1/2012 | Pei | 118/723 R |
| 2012/0012056 A1* | 1/2012 | Pei | 118/665 |
| 2012/0090542 A1* | 4/2012 | Ruby et al. | 118/712 |
| 2012/0122041 A1* | 5/2012 | Billy | 431/2 |
| 2012/0156365 A1* | 6/2012 | Ohara | 427/66 |
| 2012/0186522 A1* | 7/2012 | Adachi et al. | 118/726 |
| 2012/0285374 A1* | 11/2012 | Pei | 118/47 |

* cited by examiner

APPARATUS TO PROCESS COATING MATERIAL USING FLAME NOZZLE AND EVAPORATION DEPOSITION DEVICE HAVING SAME

BACKGROUND

1. Technical Field

The present disclosure relates to an apparatus for processing coating material and a related evaporation deposition device.

2. Description of Related Art

Evaporation deposition device typically includes a deposition chamber, a crucible and a carrier positioned in the deposition chamber. The crucible contains powdery coating materials. The carrier supports workpieces, and keeps the workpieces in opposition to the crucible. In order to keep a stable evaporation rate during the coating process, the surface of the coating material should be smooth before evaporation. Therefore, the powdery coating materials in the crucible need to be heated by high-energy electron beam. Then the melted, once powdery coating materials are compacted manually and cooled into an integral coating material with a smooth surface.

However, the coating materials may become polluted when they are compacted manually. Because of different sizes of the powdery coating materials and centralized energy of the high-energy electron beam, it is difficult to evenly heat the powdery coating materials during the heating procedure.

Therefore, an apparatus for processing coating material which can overcome the above-mentioned problems is desired.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the views.

DETAILED DESCRIPTION

Embodiments will now be described in detail below with reference to the drawings.

Figure 1:
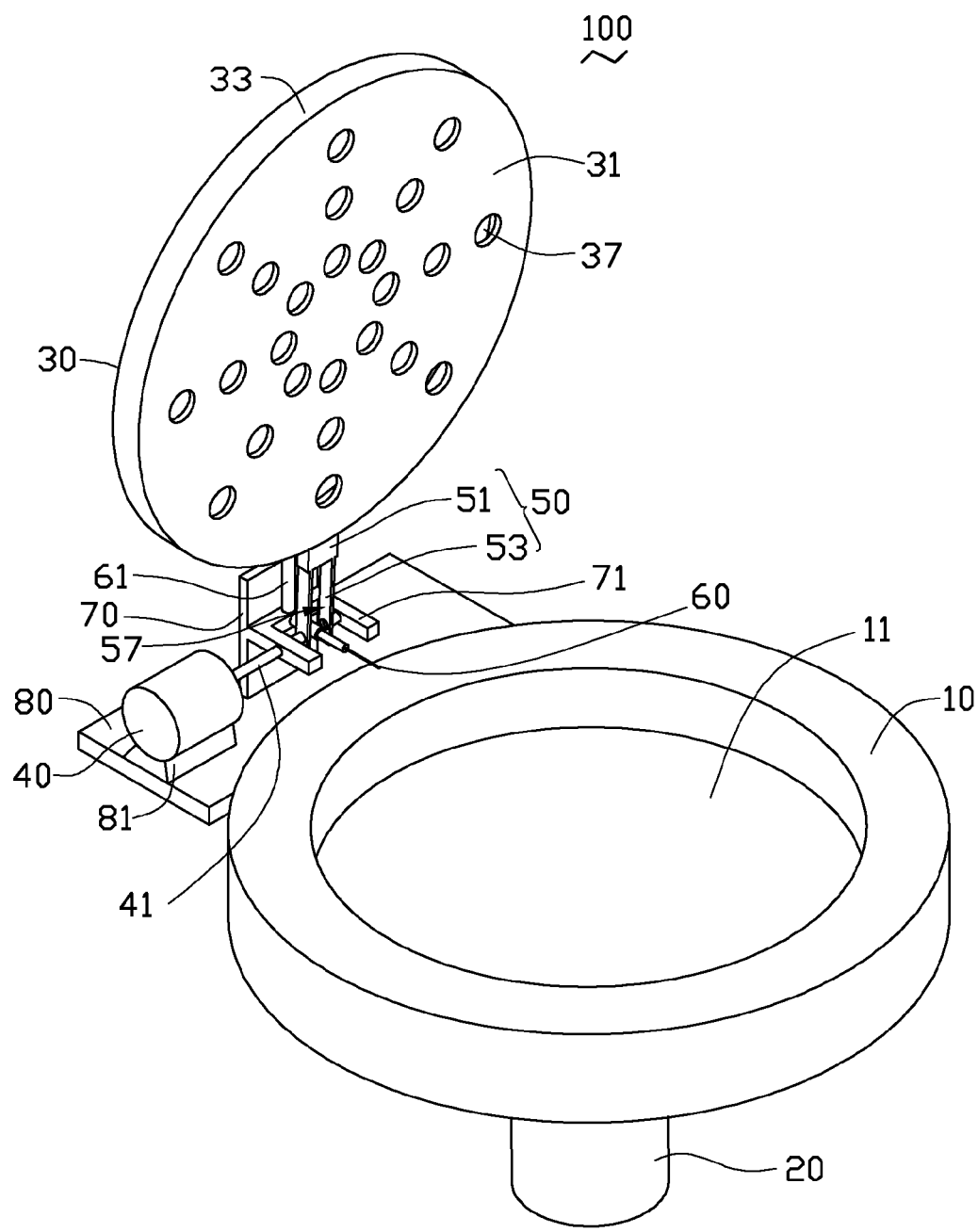
FIG. 1 is an isometric view of an apparatus for processing coating material according to a first embodiment.

Referring to FIG. 1, an apparatus 100 for processing coating material in accordance with a first embodiment is provided. The apparatus 100 includes a crucible 10, a rotating shaft 20, a cover 30, a drive member 40, a connection arm 50, and an oxyhydrogen flame nozzle 60.

The crucible 10 has a receptacle 11 for receiving the coating material. In this embodiment, the crucible 10 is made of tantalum, molybdenum, tungsten, or other thermally conductive metal or their alloys. The receptacle 11 is cylindrical. In alternative embodiments, the receptacle 11 may be cubic.

The rotating shaft 20 is coupled with the crucible 10. In this embodiment, the rotating shaft 20 is in the center area of the bottom of the crucible 10. The rotating shaft 20 is coaxial to the receptacle 11.

The rotating shaft 20 may be coupled with a motor. Therefore, the crucible 10 can move to rotate around the rotating shaft 20 with the motor.

The cover 30 includes a flat surface 31, a peripheral wall 33, a first through hole 35 (shown in FIG. 2), and a number of second through holes 37 exposed at the flat surface 31. The flat surface 31 presses against the coating material received in the receptacle 11, and flattens the coating material. The shape of the flat surface 31 matches the shape of the receptacle 11. Therefore, in the present embodiment, the flat surface 31 is circular. The first through hole 35 is defined in the peripheral wall 33, and oriented along a diametrical direction of the cover 30. The second through holes 37 are defined in the flat surface 31, and arranged along radial directions of the cover 30. Each of the second through holes 37 extend inward to the cover 30, and communicate with the first through hole 35.

In this embodiment, the cover 30 is cylindrical. The peripheral wall 33 links the two opposite circular surfaces. The flat surface 31 is one of the two opposite circular surfaces. The diameter of the flat surface 31 is equal to the diameter of the cover 30. The diameter of the flat surface 31 is less than the diameter of the receptacle 11. The cover 30 has two panels and an inner chamber 34 inside. The inner chamber 34 is defined between the two panels of the cover 30, and surrounded by the peripheral wall 33. The second through holes 37 are defined in one of the panels. The first through hole 35 and the second through holes 37 communicate with the inner chamber 34.

In an alternative embodiment, the first through hole 35 can directly communicate with each of the second through holes 37. The second through holes 37 can be arranged in several imaginable circles on the flat surface 31.

The drive member 40 drives the cover 30 to press and flatten the coating material in the receptacle 11 of the crucible 10. The drive member 40 has a drive shaft 41. The drive shaft 41 is coupled with the cover 30. Therefore, the drive member 40 can operate the cover 30 to rotate around the drive shaft 41 between a closed position and an open position. When the cover 30 is in the closed position, the receptacle 11 is covered. The cover 30 aligns with the receptacle 11 along a central axis direction of the receptacle 11 and the second through holes 37 oppose the receptacle 11. The flat surface 31 presses against the coating material to flatten the coating material. When the cover 30 is in the open position, the cover 30 is moved away from the receptacle 11.

In this embodiment, the drive shaft 41 is substantially perpendicular to the central axis of the receptacle 11 and the extending direction of the first through hole 35. The distance between the central axis of the drive shaft 41 and the central axis of the receptacle 11 is equal to the distance between the central axis of the cover 30 and the central axis of the drive shaft 41. The central axis of the receptacle 11 is tangent to the path of the central axis of the cover 30 rotates around the drive shaft 41.

The connection arm 50 has a connection end 51 and a coupling end 53. The coupling end 53 is opposite to the connection end 51. The connection end 51 is on the peripheral wall 33. The coupling end 53 is coupled with the drive shaft 41 of the drive member 40.

In this embodiment, the connection arm 50 extends along a diametrical direction of the cover 30. The connection arm 50 is in a position of the peripheral wall 33 where the first through hole 35 is defined.

Figure 2:
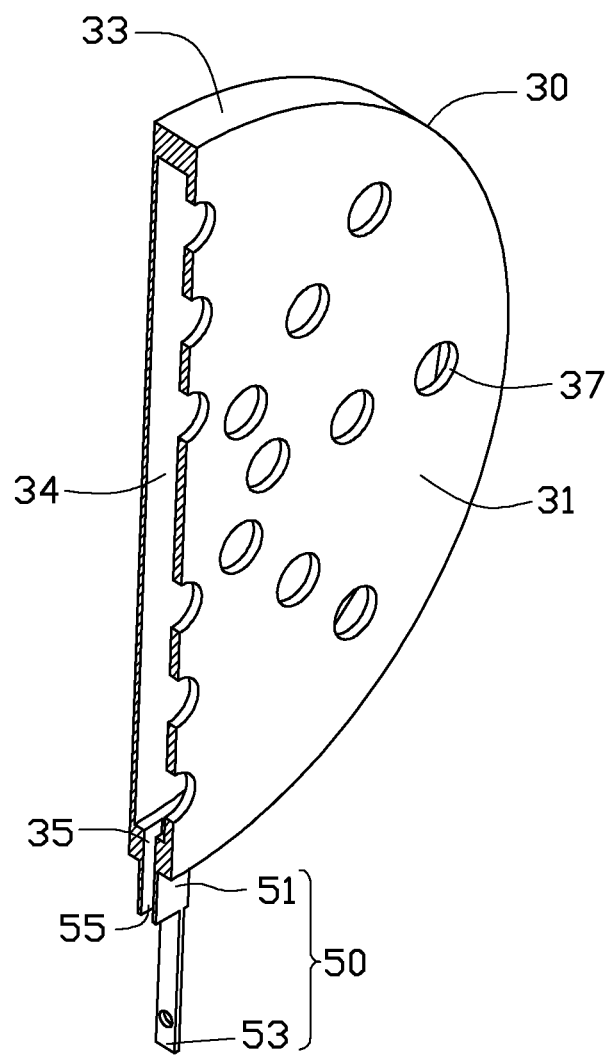
FIG. 2 is a cutaway view of the cover of the apparatus of FIG. 1.

Referring to FIG. 2, in this embodiment, the connection arm 50 has a third through hole 55, and an accommodation room 57. The third through hole 55 is positioned in the connection end 51. The third through hole 55 extends lengthwise along the connection arm 50, and communicates with the first through hole 35 of the cover 30. The accommodation room 57 communicates with the third through hole 55.

The oxyhydrogen flame nozzle 60 heats the coating material received in the receptacle 11. In this embodiment, the oxyhydrogen flame nozzle 60 is located outside the crucible 10, and opposes the receptacle 11 of the crucible 10. Therefore, the flame sprayed from the oxyhydrogen flame nozzle 60 can heat the coating material received in the receptacle 11. Hydrogen and oxygen is provided to the oxyhydrogen flame nozzle 60 by a pipe 61 connected with hydrogen and oxygen equipment (not shown).

The apparatus 100 further includes a fixing part 70, the fixing part 70 has a coupling portion 71. The oxyhydrogen flame nozzle 60 and the coupling end 53 of the connection arm 50 are secured to the fixing part 70. The axis of the oxyhydrogen flame nozzle 60 is perpendicular to the axis of the drive shaft 41. The coupling end 53 of the connection arm 50 is coupled with the coupling portion 71 by the drive shaft 41.

The apparatus 100 further includes a conveyer 80. The drive member 40 coupled with the cover 30 is on the conveyer 80. The drive member 40 is secured on the conveyer 80 with a mounting bracket 81. With the conveyer 80, the drive member 40 and the cover 30 can move forward or backward along diametrical direction of the crucible 10, therefore, the distance between the crucible 10 and the drive shaft 41 can be adjusted.

In this embodiment, the drive shaft 41 is a telescopic shaft, therefore, the height between the crucible 10 and the cover 30 can be adjusted.

Figure 3:
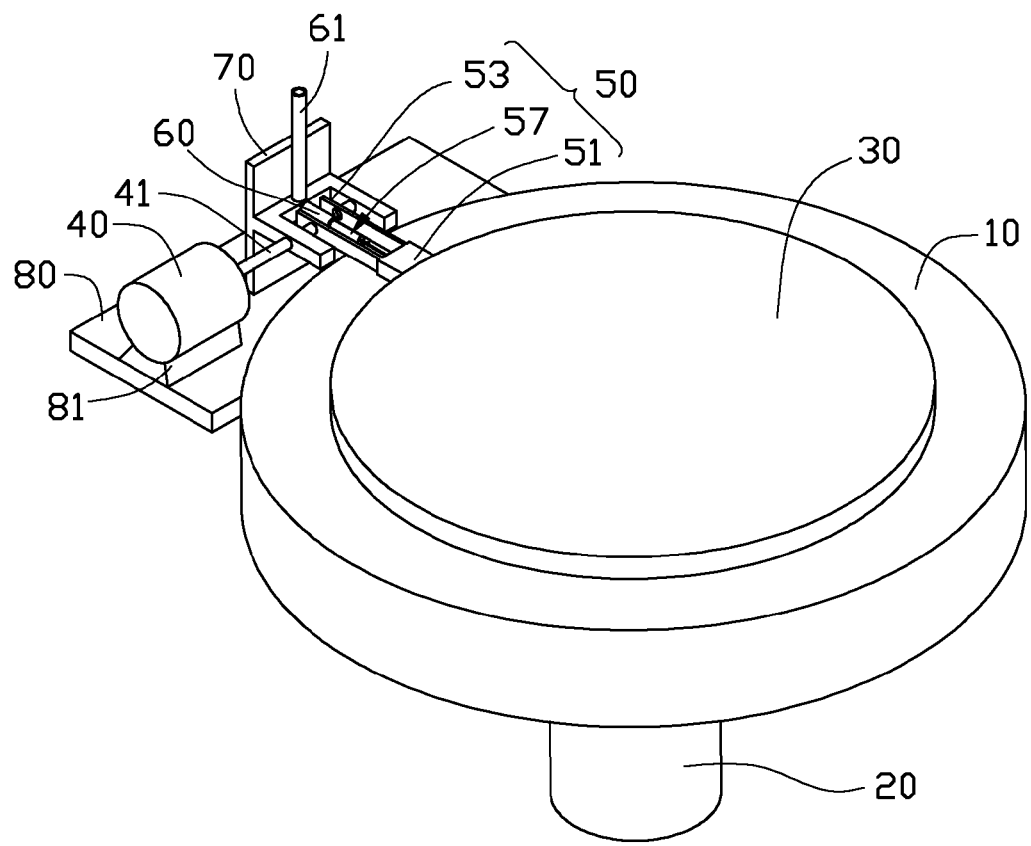
FIG. 3 is a schematic view of the apparatus of FIG. 1 in a closed position.

Referring to FIG. 2 and FIG. 3, in operation, the cover 30 covers the receptacle 11 of the crucible 10. The flat surface 31 opposes the receptacle 11. The oxyhydrogen flame nozzle 60 is accommodated in the accommodating room 57. The oxyhydrogen flame nozzle 60 extends in the direction of the first through hole 35, and opposes the third through hole 55. The flat surface 31 can press and flatten the coating materials received in the receptacle 11. Oxyhydrogen flame sprayed from the oxyhydrogen flame nozzle 60 enters the inner chamber 34 through the third through hole 55 and the first through hole 35, and sprays the coating materials received in the receptacle 11 through the second through holes 37. Therefore, the coating material received in the receptacle 11 can be heated.

In this embodiment, the drive member 40 is coupled with the connection arm 50 directly. In alternative embodiments, a transmission mechanism, such as gear transmission mechanism, may be coupled with the drive member 40 and the connection arm 50.

The first through hole 35 can be defined in the surface opposite to the flat surface 31. The oxyhydrogen flame nozzle 60 can be above the crucible 10.

Figure 4:
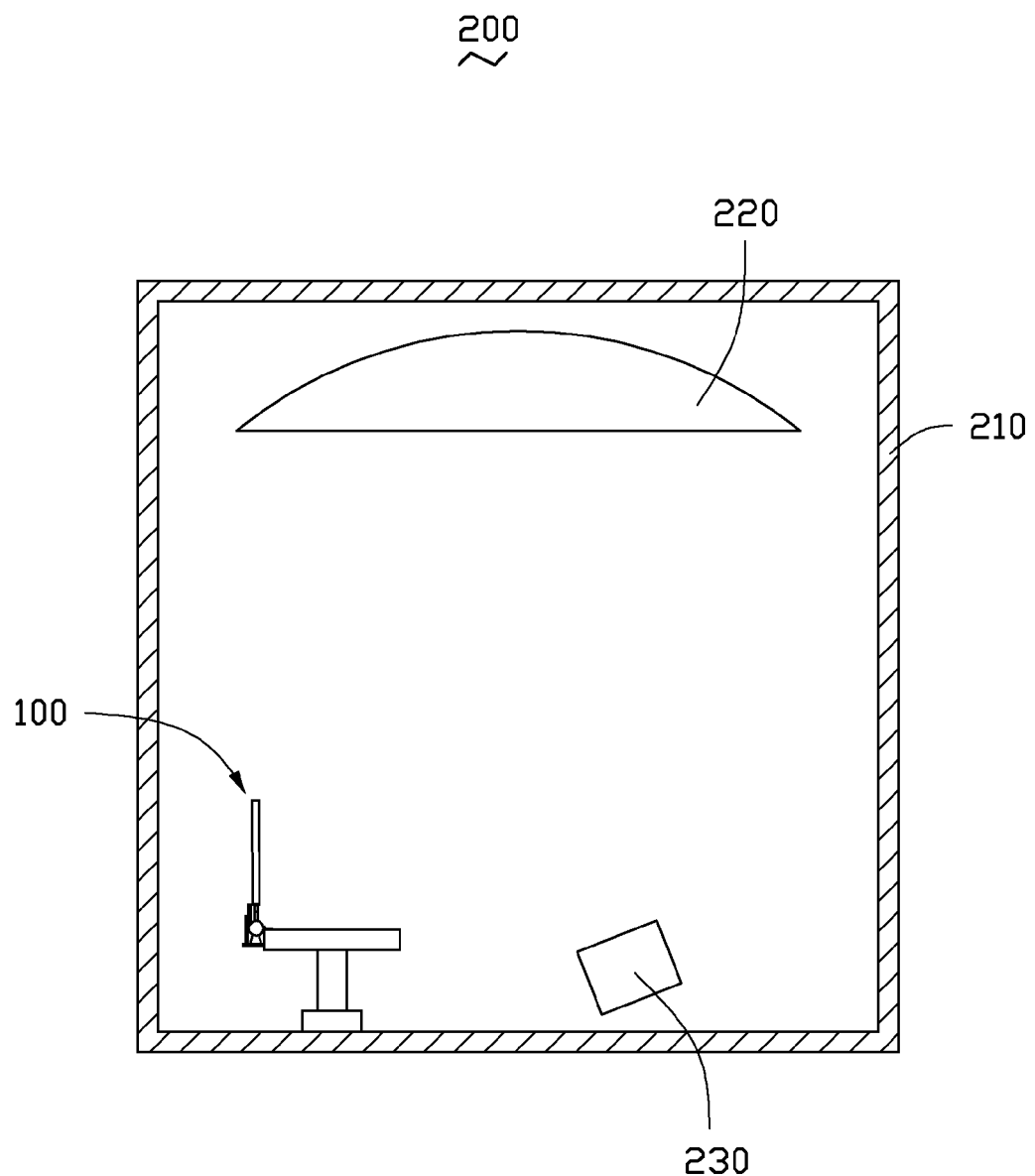
FIG. 4 is an isometric view of an evaporation deposition device according one exemplary embodiment.

Referring to FIG. 4, an evaporation deposition device 200 in accordance with an alternative embodiment is provided. The evaporation deposition device 200 includes a deposition chamber 210, a carrier 220, a plasma source 230, and an apparatus 100 for processing the coating material.

The deposition chamber 210 is a vacuum chamber. All of the following, the carrier 220, the plasma source 230 and the apparatus 100 are in the deposition chamber 210.

The carrier 220 supports workpieces, and keeps the workpieces opposed to the crucible 10 (not labeled in the FIG. 4) of the apparatus 100. The plasma source 230 forms plasma in the deposition chamber 210. In this embodiment, the oxyhydrogen flame nozzle 60 of the apparatus 100 heats the powdery coating materials and vaporizes the coating material received in the receptacle 11. Finally, the resultant materials are deposited onto the workpieces.

In this embodiment, the carrier 220 is on the top of the deposition chamber 210, and above the apparatus 100. The plasma source 230 is below the carrier 220, and opposes the carrier 220. The crucible 10 of the apparatus 100 opposes the carrier 220.

Due to the rotatable cover 30 combined with the oxyhydrogen flame nozzle 60, the apparatus 100 can process the powdery coating materials into an integral coating material with a smooth surface automatically. Thus, the apparatus 100 can greatly reduce the possibility of the coating material being polluted manually. Besides, the apparatus 100 can evenly heat the powdery coating materials during the heating procedure. Thus, it can have a stable heat rate during the heating procedure, and a stable evaporation rate during the coating process. It may be helpful for controlling the heating procedure.

It is to be understood that the above-described embodiments are intended to illustrate rather than limit the disclosure. Variations may be made to the embodiments without departing from the spirit of the disclosure. The above-described embodiments illustrate the scope of the disclosure but do not restrict the scope of the disclosure.

What is claimed is:

1. An apparatus to process coating material, comprising:
a crucible having a cylindrical receptacle for coating material therein;
a drive member comprising a drive shaft;
a cover coupled to the drive shaft, the cover comprising an inner chamber defined therein, a first through hole and a number of second through holes, the first through hole and the second through holes communicating with the inner chamber, the cover having a flat surface with the second through hole exposed at the flat surface, the drive shaft configured to drive the cover to rotate thereabout between a closed position where the cover covers the receptacle and the flat surface presses against the coating material to flatten the coating material, and an open position where the cover is moved away from the receptacle; and
a flame nozzle configured to spray flame from the first through hole through the second through holes to directly heat the coating material received in the receptacle, wherein the crucible comprises a connection arm coupled to the drive shaft, and the flame nozzle is located outside the crucible and aligned with the first through hole when the cover covers the receptacle and the connection arm defines a third through hole in the connection end and an accommodation room, and the third through hole extends lengthwise along the connection arm and communicates with the first through hole; wherein the flame nozzle is received in the accommodation room and flame is directed through the third through hole and first through hole.

2. The apparatus of claim 1, wherein the cover has two opposite panels with the inner chamber defined therebetween, the second through holes defined in one of the panels.

3. The apparatus of claim 2, wherein the cover includes a peripheral wall surrounding the inner chamber, the first through hole defined in the peripheral wall and oriented along a diametrical direction of the cover.

4. The apparatus of claim 2, wherein the second through holes are arranged along radial directions of the cover.

5. The apparatus of claim 3, wherein the drive shaft is perpendicular to the central axis of the receptacle and the extending direction of the first through hole.

6. The apparatus of claim 1, wherein the crucible is rotatable about the central axis of the receptacle.

7. The apparatus of claim 1, wherein the flame nozzle is configured to spray oxyhydrogen flame.

8. The apparatus of claim 1, wherein both the crucible and the cover are made of thermally conductive metal.

9. An evaporation deposition device, comprising:
a deposition chamber; and
a coating material processing apparatus arranged in the deposition chamber, the apparatus comprising:
    a crucible having a cylindrical receptacle for receiving coating material therein;
    a drive member comprising a drive shaft;
    a cover coupled to the drive shaft; the cover comprising:
        two opposite panels with an inner chamber defined, therebetween;
        a first through hole defined in a peripheral wall of the cover surrounding the inner chamber and oriented along a diametrical direction of the cover; and
        a number of second through holes defined in one of the panels and arranged along radial directions of the cover, the first through hole and the second through holes communicating with the inner chamber;
    the cover having a flat surface with the second through holes exposed at the flat surface; and
    the drive shaft configured to drive the cover to rotate thereabout between a closed position where the cover covers the receptacle and the flat surface presses against the coating material to flatten the coating material, and an open position where the cover is moved away from the receptacle; and
a flame nozzle configured to spray flame from the first through hole through the second through holes to directly heat the coating material received in the receptacle, wherein the crucible comprises a connection arm coupled to the drive shaft, and the flame nozzle is located outside the crucible and aligned with the first through hole when the cover covers the receptacle and the connection arm defines a third through hole in the connection end and an accommodation room, and the third through hole extends lengthwise along the connection arm and communicates with the first through hole and wherein the flame nozzle is received in the accommodation room and flame is directed through the third through hole and first through hole.

10. The evaporation deposition device of claim 9, further comprising a support for supporting workpieces thereon, and a plasma source facing the support;
wherein the support and the plasma source are received in the deposition chamber.

11. The evaporation deposition device of claim 9, wherein the drive shaft is perpendicular to the central axis of the receptacle and the extending direction of the first through hole.

12. The evaporation deposition device of claim 9, wherein the crucible comprises a connection arm coupled to the drive shaft, and the flame nozzle is located outside the crucible and aligned with the first through hole when the cover covers the receptacle.

13. The evaporation deposition device of claim 9, wherein the crucible is rotatable about the central axis of the receptacle.

14. The evaporation deposition device of claim 9, wherein the flame nozzle is configured to spray oxyhydrogen flame.

15. The evaporation deposition device of claim 9, wherein both the crucible and the cover are made of thermally conductive metal.

16. The apparatus of claim 1, wherein the drive shaft is a telescopic shaft to adjust the height between the crucible and the cover.

17. The apparatus of claim 1, wherein the flame nozzle is located outside the crucible and opposes the receptacle.

18. The apparatus of claim 1, further comprising a fixing part, wherein the flame nozzle and the connection arm are secured to the fixing part.

* * * * *